United States Patent

Watanabe et al.

[11] Patent Number: 6,072,190
[45] Date of Patent: Jun. 6, 2000

[54] MICRO CONTACT PIN STRUCTURE WITH A PIEZOELECTRIC ELEMENT AND PROBE CARD USING THE SAME

[75] Inventors: Takashi Watanabe, Aoba-ku; Minako Yoshida, Miyagi, both of Japan

[73] Assignee: Advantest Corp., Tokyo, Japan

[21] Appl. No.: 08/751,851

[22] Filed: Nov. 18, 1996

[30] Foreign Application Priority Data

Nov. 22, 1995 [JP] Japan ..................... 7-328307

[51] Int. Cl.[7] ............ H01L 23/58; H01L 29/82; H01L 23/48; H01L 23/52
[52] U.S. Cl. .............. 257/48; 257/420; 257/796; 257/635; 438/14; 438/50
[58] Field of Search ............ 257/48, 420, 697, 257/735; 438/14, 50

[56] References Cited

U.S. PATENT DOCUMENTS

| | | |
|---|---|---|
| 4,994,735 | 2/1991 | Leedy ............................. 257/48 |
| 5,454,146 | 10/1995 | Yagi et al. ...................... 29/25.35 |
| 5,536,963 | 7/1996 | Polla ............................... 257/417 |
| 5,723,894 | 3/1998 | Ueno et al. .................... 257/415 |

*Primary Examiner*—Olik Chaudhuri
*Assistant Examiner*—Howard Weiss
*Attorney, Agent, or Firm*—Muramatsu & Associates

[57] ABSTRACT

A micro contact structure and a probe card to be used in testing performance of a semiconductor integrated circuit device formed on a semiconductor wafer have improved contact characteristics. The contact structure includes a micro contact pin having electric conductivity formed on one end of a beam which is movable in a vertical direction, and a piezoelectric element formed on the beam to drive the beam in the vertical direction. The beam is made of silicon on the surface of which is formed of a conductive thin film, and the micro contact pin has a pyramid shape. The piezoelectric element is a bimorph plate mounted on an upper surface of the beam or both upper and lower surfaces of the beam.

20 Claims, 9 Drawing Sheets

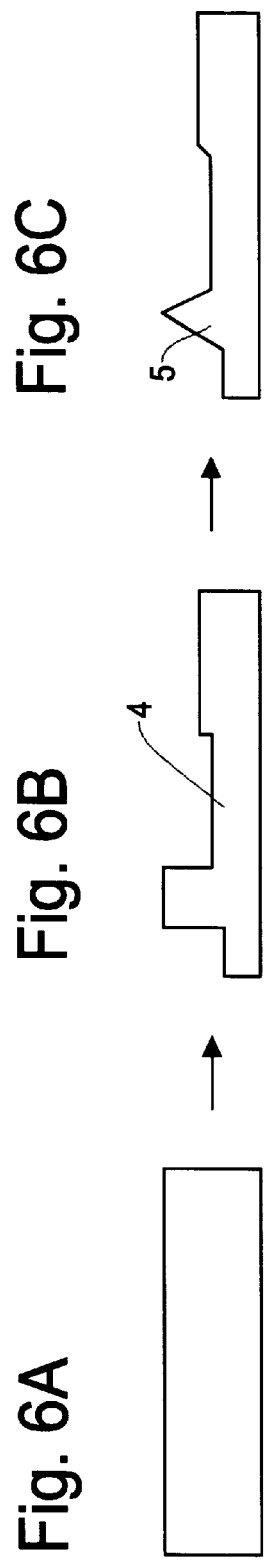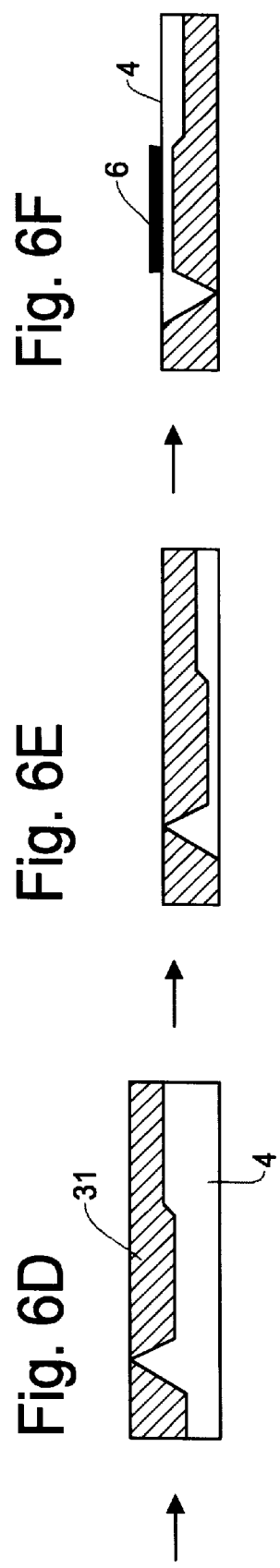

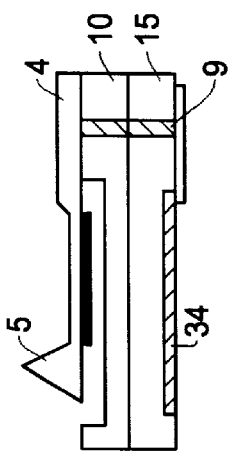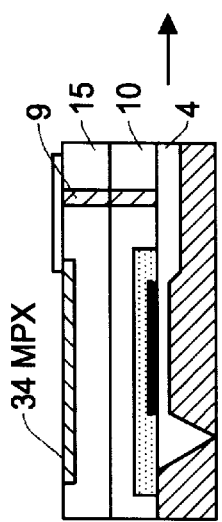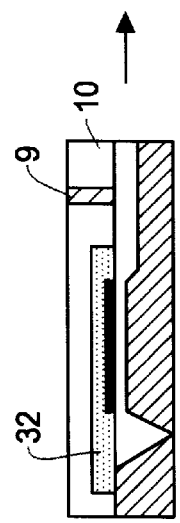

MICRO CONTACT PIN STRUCTURE WITH A PIEZOELECTRIC ELEMENT AND PROBE CARD USING THE SAME

FIELD OF THE INVENTION

This invention relates to structures of a probe card and a micro contact pin to be mounted on the probe card, which are used in testing performance of a semiconductor integrated circuit device formed on a semiconductor wafer. More particularly, this invention relates to a structure of a micro contact pin and a probe card having a large number of micro contact pins to test high density semiconductor integrated circuit devices on a semiconductor wafer.

BACKGROUND OF THE INVENTION

In testing a semiconductor integrated circuit on a semiconductor wafer such as a silicon wafer, a special machine such as a wafer prober is used which includes a probe card having a plurality of contact pins. The contact pins establish electrical connections with electrodes on the surface of the wafer to transmit signals therebetween. FIGS. 4 and 5 show an example of structure in a conventional probe card for testing such semiconductor integrated circuits on a semiconductor wafer.

In FIG. 4, the probe card has contact pins 19, an insulation plate 17 and coaxial cables 18 for testing a semiconductor device 7 which is formed on a silicon wafer 1. The semiconductor device 7 to be tested has a plurality of electrodes 2 such as bonding pads on its surface.

The contact pins 19 in this case are called pogo pins which have an elastic function with a telescopic structure. Each of the contact pins 19 is provided to face the corresponding electrode 2 of the test device 7. The electric connection will be established when the ends of the contact pins 19 are pressed on the electrodes 2. The insulation plate 7 is to place the contact pins 19 in a predetermined position and fix the contact pins in such a position. The coaxial cables 18 are connected to the upper parts of the contact pins 19 for establishing electrical communication between the test device 7 and a test system 28 shown in a block diagram of FIG. 7.

Another example of conventional probe card is shown in FIG. 5. The probe card of FIG. 5 includes a plurality of electrode bumps 21, a membrane 20, a probe frame 22, screws 23 and coaxial cables 18. The electrode bumps 21 are provided on the surface of the membrane 20 to meet the electrodes of the test device 7 on the silicon wafer 1. In addition to the electrode bumps 21, the membrane 20 is further provided with circuit patterns connected to the bumps 21 for transmitting electric signals. Namely, the electrode bumps 21 are electrically connected with the corresponding coaxial cables 18 through the circuit patterns.

A plunger 24, screws 23, a spring 25 and a pressure sensor 26 are provided to establish up-down movements of the electrode bumps 21 and the membrane 20. Thus, the electrode bumps 21 are pressed on the electrodes to form electric connections therebetween. A probe frame 22 supports the various components noted above and allows the up-down movements of the electrode bumps 21.

The position of the electrode bumps 21 with respect to the electrodes 2 on the test device 7 is adjusted by positioning the plunger 24 in vertical and horizontal directions by the screws 23. Thus, the communication by electric signals between the semiconductor device 7 under test and a semiconductor test system 28 (FIG. 7) will be made through the coaxial cables 18.

Because of the increasing density and operation speed in the semiconductor integrated circuits, probe cards for testing the integrated circuits on the semiconductor wafer need to have contact pins with higher density and better impedance matching at the connection points. Further, because of the increasing density and the scale of the integrated circuits, the contact pins on the probe card are required to maintain the sufficient electric contact with the electrodes on the wafer even when the flatness of the wafer is fluctuated or deteriorated.

When the electrodes 2 of the test device 7 are aluminum electrodes, to secure the electric contact between the electrodes 2 and the contact pins on the probe card, it is also required to have a scrubbing function for removing an oxide film on the surface of the electrode 2. This scrubbing function is considered to maintain the sufficient electric contact with high reliability.

In the conventional probe card using the contact pins 19 shown in FIG. 4, it is possible to make the tip of the contact pin 19 small enough to match the size of the electrode 2 on the wafer. However, because the contact pin 19 needs to have a sufficient size to maintain the enough mechanical rigidity, and the spaces for connection with the coaxial cables 18 must be provided, it is considered that the minimum distance between the contact pins 19 is limited to about 1 mm pitch.

In the conventional probe card using the electrode bumps 21 on the membrane 20 as shown in FIG. 5, it is possible to have higher density of the electrode bumps than the density of the probe card using the contact pins 19 of FIG. 4. However, the density of FIG. 5 is still limited to the order of about 0.5 mm. Further, the example of FIG. 5 is not adequate to overcome the deterioration of the flatness of the wafer surface since the electrode bump 21 is not independent from the others. By the same reason, the scrubbing function for removing the oxide film of the electrodes of the test device is not available.

Therefore, in the conventional probe card using the pogo pin type contact pins or the membrane having the bumps are suitable to meet the requirement of the recent semiconductor integrated circuit having an ultra small pitch between the electrodes. It is necessary to develop a probe card and a contact pin structure having a new approach to overcome the dimensional limit and to meet the needs of the high density semiconductor device.

SUMMARY OF THE INVENTION

Therefore, it is an object of the present invention to provide a contact structure for electrically connecting a contact pin with an electrode of a device to be tested formed on a semiconductor wafer which is capable of reducing the pitch between the adjacent contact pins to test a high density semiconductor device.

It is another object of the present invention to provide a contact structure for electrically connecting a contact pin with an electrode of a device to be tested with high stability and high reliability by overcoming the fluctuations of flatness of the electrodes of the device to be tested.

It is a further object of the present invention to provide a contact structure for electrically connecting a contact pin with an electrode of a device to be tested with high stability and high reliability by scrubbing a surface of the electrode by the contact pin.

It is a further object of the present invention to provide a probe card having a contact structure of the present invention and a production method of the contact structure of the present invention.

The contact structure of the present invention includes a micro contact pin having electric conductivity formed on one end of a beam which is movable in a vertical direction, and a piezoelectric element formed on the beam to drive the beam in the vertical direction. The beam is made of silicon on the surface of which is formed of a conductive thin film, and the micro contact pin has a pyramid shape. The piezoelectric element is a bimorph plate mounted on an upper surface of the beam or both upper and lower surfaces of the beam.

Another aspect of the present invention is a probe card for establishing electrical connections between electrodes of a plurality of semiconductor circuits on a wafer and a semiconductor test system. The probe card is formed of a plurality of micro contact pins formed on corresponding beams and positioned relative to the electrodes of all of the semiconductor circuit on the wafer where each of the micro contact pins has electric conductivity and is formed on one end of each of the beams which is movable in a vertical direction, a plurality of piezoelectric elements formed on the beams to drive the corresponding beams in the vertical direction; and a multiplexing circuit for selecting a group of the micro contact pins to transmit signals between selected one of the semiconductor devices and the semiconductor test system.

According to the present invention, because of the structure of the micro contact pin of the present invention, each of the contact pin has elasticity independently from the others. Thus, the contact pins can overcome the fluctuations of the surface flatness of the semiconductor device to be tested on the wafer. Since the contact pins are independent of the other and separately move in the up and down direction, the scrubbing effect is available on the contact surfaces of the electrodes. Thus, the electric contact with high stability and reliability is achieved by the contact pin of the present invention.

Further, the probe card can be produced in such a manner to cover all the semiconductor circuits formed on the wafer. The probe card includes the multiplexing circuit to switch the electric connections between the semiconductor circuit under test and the semiconductor test system. In this arrangement, without using an X-Y stage, all the semiconductor circuits can be tested by selecting the semiconductor circuit to be tested. Thus, the mechanical positioning is not required during the testing, which improves the positioning accuracy between the contact pins and the device under test and reduces the overall time for the testing.

BRIEF DESCRIPTION OF THE DRAWINGS

FIGS. 6A–6I are diagrams showing an example of process for producing a micro contact pin of the present invention.

DETAILED DESCRIPTION OF THE PREFERRED EMBODIMENT

Figure 1:
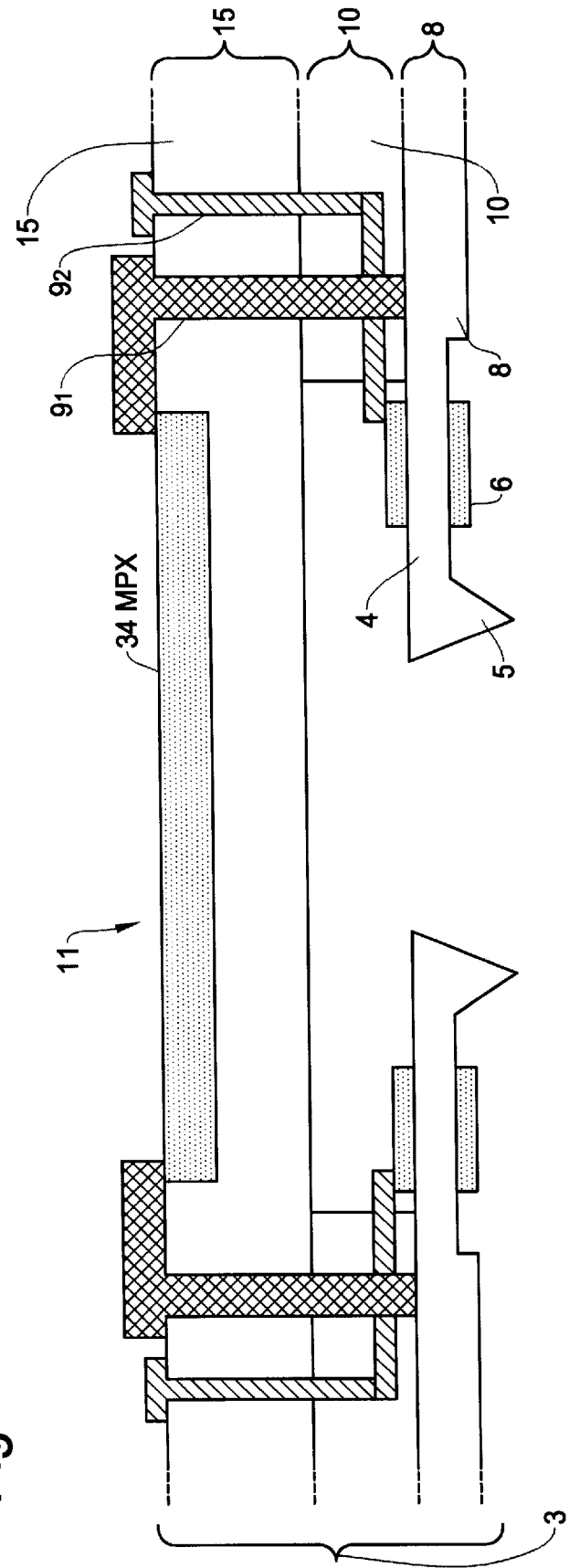
FIG. 1 is a partial cross sectional view showing the probe card of the present invention wherein the probe card is formed of a three layer silicon substrate for two lines of electrodes running in parallel on the semiconductor device to be tested.

The preferred embodiment of the present invention is explained in the following with reference to FIG. 1. FIG. 1 is a partial cross sectional view showing a probe card of the present invention wherein the probe card is formed of a three layer silicon substrate for contacting two lines of electrodes running in parallel provided on the semiconductor device to be tested.

In the cross sectional view of FIG. 1, a probe card 3 has a three layer structure by having three silicon substrates, a first substrate 8, a second substrate 10 and a third substrate 15. A beam 4 is formed on a first silicon substrate 8 by an appropriate technology such as a micro machining. The beam 4 has elasticity in an up-down direction.

Figure 2:
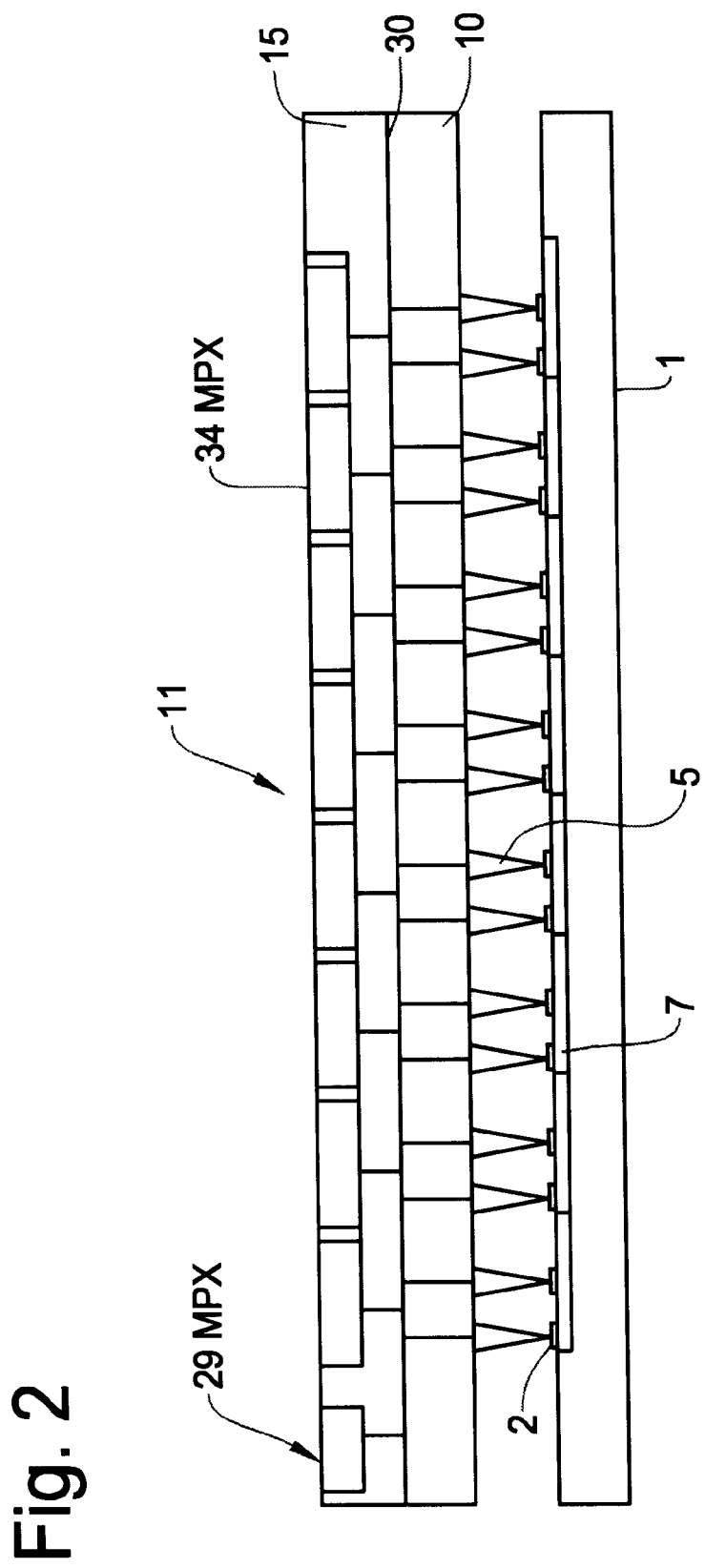
FIG. 2 is a cross sectional view showing an example of arrangement wherein a probe card is integrally formed to have a large number of micro contact pins of the present invention corresponding to all of the semiconductor devices to be tested on the wafer.

As shown in FIG. 2, the test device 7 on the semiconductor wafer 1 has electrodes 2. A micro contact pin 5 is provided at the end of each of the beams 4 to face the corresponding electrode 2 on the test device 7. The micro contact pin 5 has a conductive film on its surface to secure electric conductivity. The micro contact pin 5 and the third silicon substrate 15 are electrically connected through a via hole $9_1$.

A piezoelectric element 6 is provided in a sandwich manner on the beam 4. The piezoelectric element 6 has a thin film shape and is electrically insulated from the beam 4. A piezoelectric element drive circuit 11 is provided on the third silicon substrate 15. Input terminals of the piezoelectric element 6 is electrically connected to the piezoelectric drive circuit 11 through a via hole $9_2$. When the driver circuit 11 supplies an electric signal to the piezoelectric element 6, the movement in the up-down direction is produced in the beam 4 by the piezoelectric element 6.

To secure the up-down movement of the beam 4 and thus the micro contact pin 5, the second silicon substrate 10 is cut out to form a recess for the micro contact pin 5. The second silicon substrate 10 is also used for mounting an inner circuit 30 for transmitting various signals, such as multiplexing signals for switching the signals in the probe card. As in the foregoing, the third silicon substrate 15 is used for mounting the piezoelectric element drive circuit 11. The third silicon substrate 15 is also used, along with the second silicon substrate 10, for mounting a circuit pattern including a multiplexing circuit 34.

The piezoelectric element drive circuit 11 is provided for each test device. Typically, a drive signal of several ten voltage is generated by a high voltage generator in the drive circuit 11. The drive signal is supplied to a plurality of the piezoelectric elements 6 so that the contact pins 5 are driven to contact with the electrodes 2 on the test device 7. Thus, all the contact pins 5 for the test device 7 are ON/OFF controlled, i.e., connected with or disconnected with respect to all of the electrodes, at the same time.

Because of the structure of the micro contact pin of the present invention, each of the contact pin has elasticity independently from the others. Thus, the contact pins can overcome the deterioration of flatness on the surface of the electrodes, i.e., the semiconductor wafer. Since the contact pins are independent from the other and separately move in the up and down direction, the scrubbing effect is available on the contact surfaces of the electrodes.

The piezoelectric element 6 is formed on either the top or the bottom surface, or both of the top and bottom surfaces of the beam 4 through a sputtering or a vapor deposition process. Through this film forming process, a bimorph is formed having layers of silicon oxide ($SiO_2$)-gold-PLZT-gold-PLZT-gold, for example. PLZT is a piezoelectric material having, for example, lead, lanthanum, zinc and titanium oxide. By this structure, the piezoelectric element 6 bends in proportion to the applied voltage, resulting in the vertical movement of the micro contact pin 5.

Figure 3:
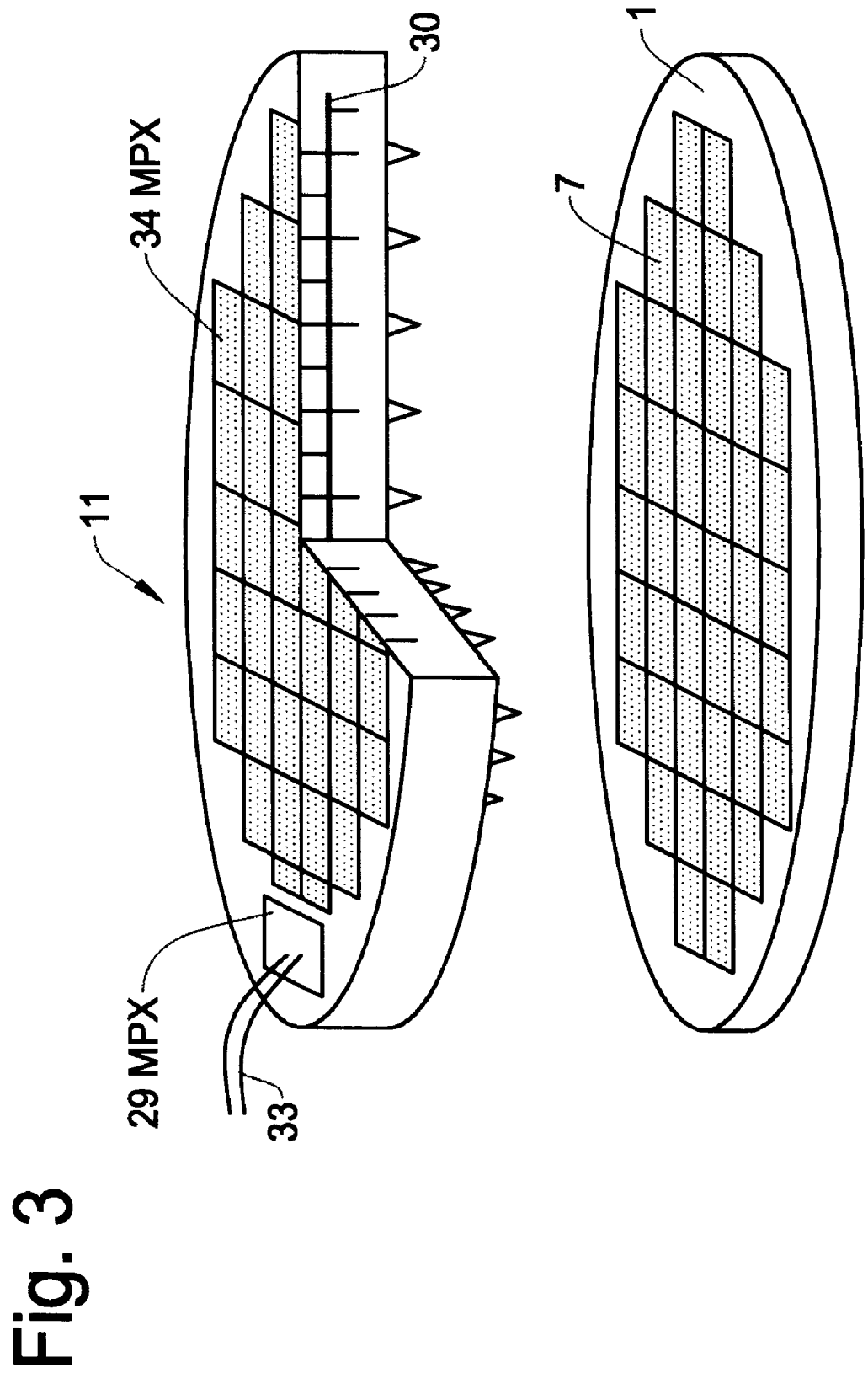
FIG. 3 is a perspective view showing an example of arrangement wherein the probe card of FIG. 2 is provided corresponding to all of the semiconductor devices to be tested on the wafer.
Figure 4:
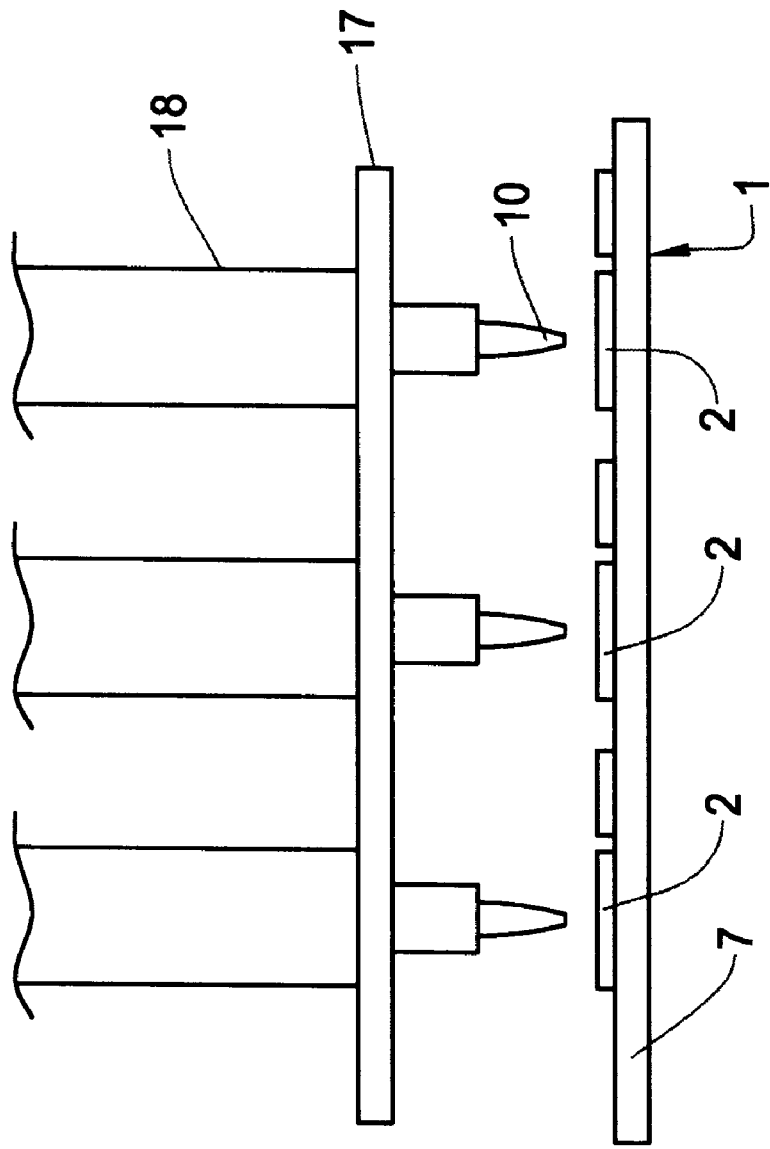
FIG. 4 is a cross sectional view showing a contact structure in a conventional probe card.
Figure 5:
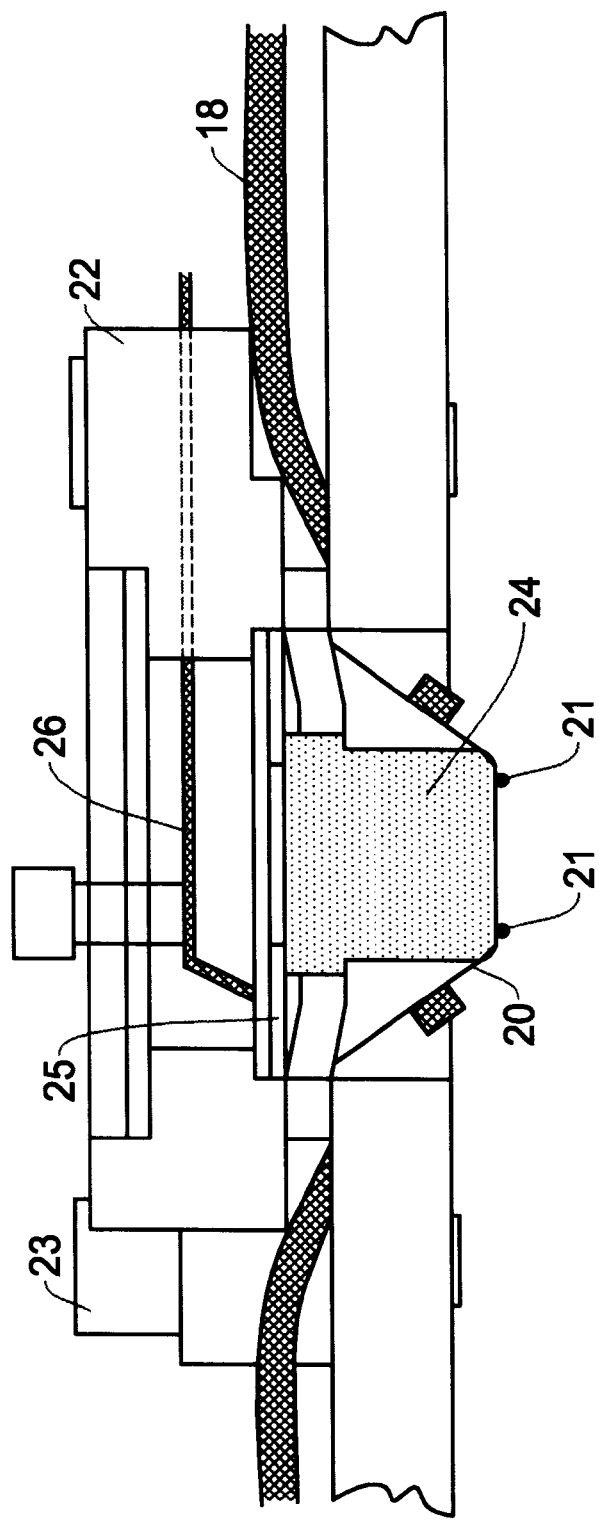
FIG. 5 is a cross sectional view showing a contact structure in another conventional probe card.

The electric insulation between the beam 4 and the piezoelectric element 6 is attained by the silicon oxide film on the piezoelectric element 6. Since the break down voltage of the silicon oxide film is 10 V/1 $\mu$m, a film thickness of 3–5 micrometer is sufficient for the drive voltage of 20–30 V. As shown in FIGS. 1–3, the piezoelectric elements 6 are connected to the drive circuits 11 and the inner circuit 30 through the via holes 9.

As noted above, the recess for the movement of the contact pins 5 is formed between the first silicon substrate 1 and the third silicon substrate 15 by removing the corresponding portion of the second silicon substrate 10. Thus, in this example, the micro contact pins 5 are movable about 10 $\mu$m in the vertical direction. This degree of movement is sufficient to compensate the irregularity of the surfaces of electrodes 2 or the curvature of the wafer 1 under test.

Although not shown, the connection between a plurality of the contact pins 5 and an external circuit may be established by, for example, arranging a ceramic substrate close to the probe card of the present invention and bonding the appropriate parts therebetween.

Figure 8:
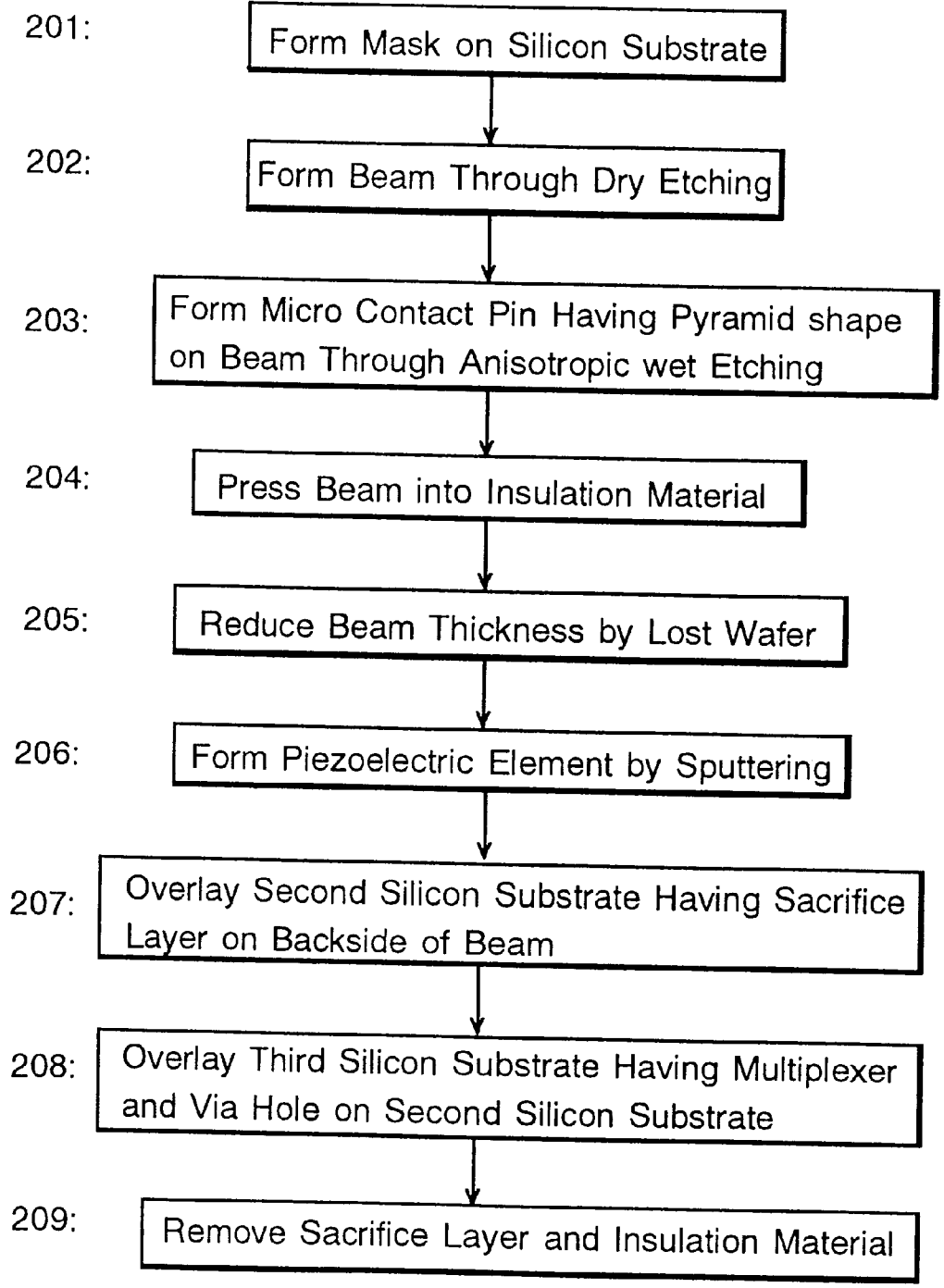
FIG. 8 is a flow chart showing a process of producing the micro contact pin of the present invention.

A process for producing the micro contact structure of the present invention is described with reference to FIGS. 6 and 8. FIG. 6 is a diagram showing an example of process for producing the micro contact pin of the present invention and FIG. 8 is a flow chart showing a production process for forming the micro contact pin of the present invention.

In this example, a silicon material of a (100)-crystal plane is used as a silicon substrate. The silicon substrate of FIG. 6A is proceeded to a lithography and dry etching process of FIG. 6B. A mask is formed through a photolithography process to transfer patterns of geographic shapes of mask to a thin layer of radiation-sensitive material, i.e., resist. The silicon substrate having the resist pattern formed by the lithography is then proceeded to the dry etching process. For example, carbon hexafluoride ($C_2F_6$) gas may be used for this etching process. A beam 4 of 200 $\mu$m thick and 500 $\mu$m long is formed. The beam 4 has a rectangular protrusion of 100×100×100 $\mu$m at its end.

For the rectangular portion of the beam 4, a micro contact pin 5 is formed through an anisotropic wet etching as shown in FIG. 6C. The micro contact pin 5 has a pyramid shape of about 50 $\mu$m high which is surrounded by (111)-crystal planes. A 3N-solution of isopropyl alcohol and potassium hydroxide (KOH) may be used for this anisotropic wet etching process. To establish electric conductivity of the beam, conductive material such as gold film is formed on the surface of the beam through a sputtering process.

The beam 4 is pressed in an insulation material 31 such as polyimide as shown in FIG. 6D and is provided with a lost wafer process in which the thickness is reduced from 200 $\mu$m to 50 $\mu$m in the backside as shown in FIG. 6E. A nitric acid solution may be used for this process.

Through a sputtering process or a vapor deposition process, a piezoelectric element 6 is formed on the beam 4 in FIG. 6F. Through this film forming process, a bimorph is formed having two layers of piezoelectric films. For example, the bimorph has silicon oxide ($SiO_2$)-gold-PLZT-gold-PLZT-gold. PLZT is a piezoelectric material having lead, lanthanum, zinc and titanium oxide.

Through an ordinary semiconductor production process, via holes 9 and micro strip lines are formed on the beam 4 as shown in FIG. 6G. Also, a second silicon substrate 10 having a sacrificial layer 32 made of silicon oxide ($SiO_2$) is overlaid on the beam 4. The sacrificial layer 32 should be positioned over the upper surface of the beam 4 encompassing the piezoelectric element 6 and the backside of the micro contact pin 5.

A third silicon substrate 15 is overlaid on the second silicon substrate 10 as shown in FIG. 6H. The third silicon substrate 15 is provided with a piezoelectric element drive circuit 11 and a multiplexing circuit 34 through an ordinary process of forming an integrated circuit. Electric connections are established through the via holes 9 from the drive circuit 11 and the piezoelectric element 6 by filling the electric conductive material in the holes 9.

The sacrificial layer 32 and the insulation material 31 are removed in FIG. 6I to allow an up-down movement of the beam 4. The piezoelectric element 6 may be provided on the other side of the beam 4 in the last process to form a sandwich type structure of FIG. 1. This process is the same as the one in FIG. 6F above.

Under the process of the present invention, a probe card 3 having the beams aligned in a 100 $\mu$m pitch is easily produced. In the above production process, the third silicon substrate 15 may not be absolutely necessary to form a probe card. In such a case, without having the third substrate 15, a piezoelectric element drive circuit may be formed on the second substrate 10. Alternatively, bonding pads may be formed on the second substrate 10 to receive a drive signal from an outer circuit arrangement (not shown) such as on a ceramic substrate through wire bonding.

The flow chart of FIG. 8 shows the same production process as discussed with reference to FIG. 6. Namely, the mask is formed on the silicon substrate in the step 201 and the beam 4 having the rectangular protrusion at its end is formed through the dry etching process in the step 202. For the rectangular portion of the beam 4, the micro contact pin 5 having the pyramid shape is formed through the anisotropic wet etching in the step 203.

The beam 4 is pressed in the insulation material 31 such as polyimide in the step 204. The thickness of the beam 204 is reduced by the lost wafer process in the backside of the beam in the step 205. Through the sputtering process, the piezoelectric element 6 is formed on the beam 4 in the step 206. The second silicon substrate 10 having the sacrifice layer 32 and the via holes 9 is overlaid on the beam 4 in the step 207. The third silicon substrate 15 having the multiplexing circuit 34 and the via holes 9 is overlaid on the second silicon substrate 10 in the step 208. The sacrifice layer 32 and the insulation material polyimide are removed in the step 209.

The probe card of the present invention may be configured to match with one or more semiconductor circuits 7 on the semiconductor wafer 1. Thus, the probe card may cover a part of the wafer 1 to be tested. In such a situation, either the probe card of the present invention or the wafer 1 under test must be mounted on an X-Y stage for shifting the relative position to test the other circuits on the wafer 1.

Alternatively, the probe card may be integrally configured in a manner equivalent to the wafer 1 to be tested to cover all of the semiconductor circuits 7 on the wafer 1. FIGS. 2 and 3 show such an embodiment which covers all of the semiconductor circuits 7 formed on the wafer 1. In this arrangement, an X-Y stage is unnecessary since the micro contact pins 5 are provided corresponding to all of the electrodes on the wafer 1.

In the example of FIGS. 2 and 3, a group of micro contact pins 5 corresponding to the semiconductor circuit 7 under test are driven by a drive signal from the piezoelectric element drive circuit 11 at the same time. After testing one semiconductor circuit 7, another group of micro contact pins 5 are driven to test the next semiconductor circuit 7 on the wafer. Thus, the contact pins over the semiconductor circuit 7 under test are active while the contact pins for the semiconductor circuits not in the test are inactive.

Figure 7:
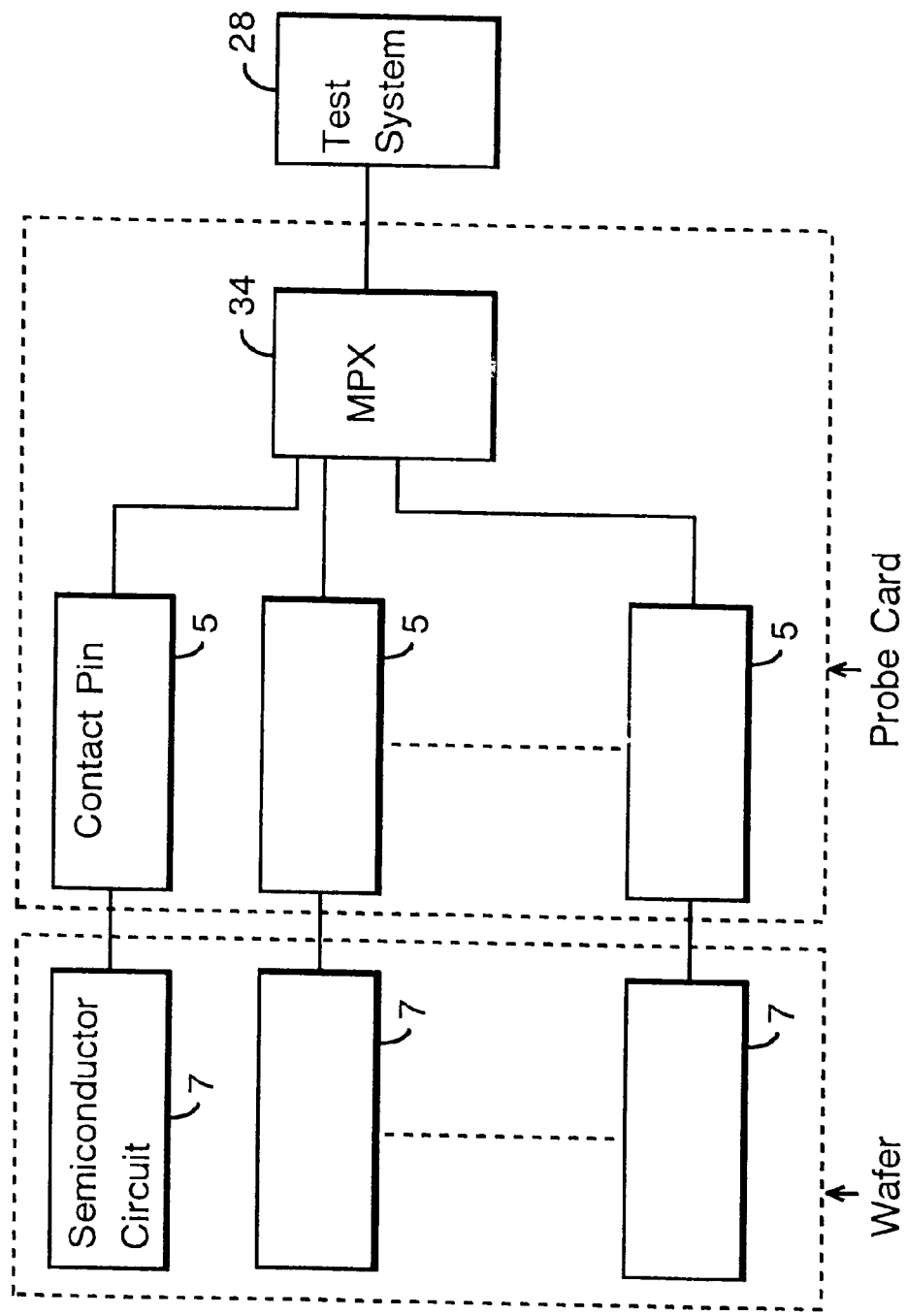
FIG. 7 is a schematic block diagram showing an electric connection wherein a plurality of semiconductor devices to be tested are sequentially tested through micro contact pins and a multiplexer of another embodiment of the present invention.

For the semiconductor circuit 7 under test, test signals from a semiconductor test system are provided through the micro contact pins 5 and the resulted output signals are received by the test system. As shown in FIG. 7, such test signals and resulted signals for the corresponding semiconductor circuit are selected by a multiplexing circuit 34 and a multiplexer driver 29 provided on the third silicon substrate 15 of the probe card 3. For example, the multiplexer driver 29 provides a drive signal to the multiplexer circuit 34 to select a group of the micro contact pins 5 corresponding to the semiconductor device 7 under test. Through the multiplexer circuit 34, the selected semiconductor circuit 7 and the semiconductor test system 28 are connected one another via the micro contact pins 5.

According to the present invention, because of the structure of the micro contact pin of the present invention, each of the contact pin has elasticity independently from the others. Thus, the contact pins can overcome the fluctuations of the surface flatness of the semiconductor device to be tested on the wafer. Since the contact pins are independent of the other and separately move in the up and down direction, the scrubbing effect is available on the contact surfaces of the electrodes. Thus, the electric contact with high stability and reliability is achieved by the contact pin of the present invention.

Further, the probe card can be produced in such a manner to cover all the semiconductor circuits formed on the wafer. The probe card includes the multiplexing circuit to switch the electric connections between the semiconductor circuit under test and the semiconductor test system. In this arrangement, without using an X-Y stage, all the semiconductor circuits can be tested by selecting the semiconductor circuit to be tested. Thus, the mechanical positioning is not required during the testing, which improves the positioning accuracy between the contact pins and the device under test and reduces the overall time for the testing.

What is claimed is: :

1. A contact structure for electrically connecting a contact pin with an electrode of a device, comprising:

a plurality of beams formed on a semiconductor substrate with a pitch equivalent to a pitch of electrodes on a semiconductor device under test (DUT), where each of the beams formed with:

a micro contact pin having electric conductivity and integrally formed on one end of the beam which is movable in a vertical direction; and a piezoelectric element formed on said beam to drive said micro contact pin in said vertical direction when a drive signal is supplied to the piezoelectric element;

wherein the vertical movement of each of the micro contact pins is selectively made by the drive signal, and wherein the vertical movement of each micro contact pin is independent from that of the other micro contact pins thereby contacting a target electrode on the DUT without causing any mechanical movement in the other micro contact pins.

2. A contact structure as defined in claim 1, wherein said beam is made of silicon on the surface of which is formed of a conductive thin film, and said micro contact pin has a pyramid shape so that a sharp end of the pyramid shape producing a scrubbing effect when pressed against the electrode on the DUT.

3. A contact structure as defined in claim 1, wherein said piezoelectric element is a bimorph plate mounted on an upper surface of said beam and is connected to a signal path for receiving the drive signal.

4. A contact structure as defined in claim 1, wherein said piezoelectric element is formed of two bimorph plates mounted on an upper surface and a lower surface of said beam, respectively, and is connected to a signal path for receiving the drive signal.

5. A contact structure as defined in claim 1, wherein said piezoelectric element on each of the beams is formed of a bimorph plate having silicon oxide ($SiO_2$)-gold-PLZT-gold-PLZT-gold layers.

6. A probe card for establishing electrical connections between an electrode of a semiconductor circuit on a wafer and a semiconductor test system, comprising:

a plurality of beams formed on a semiconductor substrate with a pitch equivalent to a pitch of electrodes on a semiconductor device under test (DUT), where each of the beams formed with:

a micro contact pin corresponding to one of said electrodes and having electric conductivity, said micro contact pin being integrally formed on one end of beam which is movable in a vertical direction; and a piezoelectric element formed on said beam to drive said micro contact pin in said vertical direction when a drive signal is supplied to the piezoelectric element;

wherein the vertical movement of each of the micro contact pins is selectively made by the drive signal, and wherein the vertical movement of each micro contact pin is independent from that of the other micro contact pins thereby contacting a target electrode on the DUT without causing any mechanical movement in the other micro contact pins.

7. A probe card as defined in claim 6, said semiconductor substrate comprising a first silicon substrate and a second silicon substrate overlaid one another, said beam is formed on said first silicon substrate, said second silicon substrate has a via hole to form a signal path between said micro contact pin and an external circuit.

8. A probe card as defined in claim 6, said semiconductor substrate comprising a first silicon substrate, a second silicon substrate and a third silicon substrate overlaid one another, said beam is formed on said first silicon substrate, said second and third silicon substrates have a via hole to form a signal path between said micro contact pin and an external circuit.

9. A probe card as defined in claim 8, wherein said second silicon substrate has a circuit pattern for transmitting test signals therethrough and said third silicon substrate has a circuit pattern for transmitting the drive signal therethrough for driving said piezoelectric element.

10. A probe card as defined in claim 6, wherein said beam is made of silicon on the surface of which is formed of a conductive thin film, and said micro contact pin has a pyramid shape so that a sharp end of the pyramid shape producing a scrubbing effect when pressed against the electrode on the DUT.

11. A contact structure as defined in claim 6, wherein said piezoelectric element is a bimorph plate mounted on an upper surface of said beam and is connected to a signal path for receiving a drive signal.

12. A contact structure as defined in claim 6, wherein said piezoelectric element is formed of two bimorph plates mounted on an upper surface and a lower surface of said beam, respectively, and is connected to a signal path for receiving a drive signal.

13. A contact structure as defined in claim 6, wherein said piezoelectric element on each of the beams is formed of a bimorph plate having silicon oxide ($SiO_2$)-gold-PLZT-gold-PLZT-gold layers.

14. A probe card for establishing electrical connections between electrodes of a plurality of semiconductor circuits on a wafer and a semiconductor test system, comprising:

a plurality of beams formed on a semiconductor substrate with a pitch equivalent to a pitch of electrodes on a semiconductor wafer under test (DUT), a plurality of micro contact pins formed on the corresponding beams and positioned relative to said electrodes of all of semiconductor circuits on said wafer, each of said micro contact pins having electric conductivity and being integrally formed on one end of each of said beams which is movable in a vertical direction;

a plurality of piezoelectric elements formed on said beams to drive said corresponding micro contact pins in said vertical direction when a drive signal is provided to said piezoelectric elements; and a multiplexing circuit for selecting a group of said micro contact pins to transmit signals between selected one or more of said semiconductor circuits and said semiconductor test system;

wherein the vertical movement of each of the micro contact pins is selectively made by the drive signal, and wherein the vertical movement of each micro contact pin is independent from that of the other micro contact pins thereby contacting a target electrode on the DUT without causing any mechanical movement in the other micro contact pins.

15. A probe card as defined in claim 14, said semiconductor substrate comprising a first silicon substrate and a second silicon substrate overlaid one another, said beams are formed on said first silicon substrate, said second silicon substrate has via holes to form signal paths between said micro contact pins and said semiconductor test system.

16. A probe card as defined in claim 14, said semiconductor substrate comprising a first silicon substrate, a second silicon substrate and a third silicon substrate overlaid one another, said beams are formed on said first silicon substrate, said second and third silicon substrate have via holes to form signal paths between said micro contact pins and said semiconductor test system.

17. A probe card as defined in claim 16, further comprising a drive circuit for driving said piezoelectric elements, said drive circuit and said multiplexing circuit are formed on said third silicon substrate.

18. A probe card as defined in claim 14, wherein each of said beams is made of silicon on the surface of which is formed of a conductive thin film, and each of said micro contact pins has a pyramid shape so that a sharp end of the pyramid shape producing a scrubbing effect when pressed against the electrode on the DUT.

19. A contact structure as defined in claim 14, wherein each of said piezoelectric elements is a bimorph plate mounted on an upper surface of said beam and is connected to a signal path for receiving a drive signal.

20. A contact structure as defined in claim 14, wherein each of said piezoelectric elements is formed of two bimorph plates mounted on an upper surface and a lower surface of said beam, respectively, and is connected to a signal path for receiving a drive signal.

* * * * *